United States Patent [19]

Rolson

[11] Patent Number: 5,780,188

[45] Date of Patent: Jul. 14, 1998

[54] LITHOGRAPHIC SYSTEM AND METHOD FOR EXPOSING A TARGET UTILIZING UNEQUAL STEPPING DISTANCES

[75] Inventor: J. Brett Rolson, Boise, Id.

[73] Assignee: Micron Technology, Inc., Boise, Id.

[21] Appl. No.: 916,833

[22] Filed: Aug. 22, 1997

[51] Int. Cl.⁶ .............................. G03F 9/00; G03B 27/42
[52] U.S. Cl. ..................... 430/30; 430/5; 430/22; 430/296; 430/312; 430/394; 430/942; 430/967; 355/53
[58] Field of Search .................... 430/5, 22, 30, 430/296, 312, 394, 942, 967; 355/53

[56] References Cited

U.S. PATENT DOCUMENTS

| | | | |
|---|---|---|---|
| 5,281,500 | 1/1994 | Cathey et al. | 430/5 |
| 5,439,764 | 8/1995 | Alter et al. | 430/5 |
| 5,576,126 | 11/1996 | Rolfson | 430/5 |

OTHER PUBLICATIONS

"Intelligent design splitting in the stencil mask technology used for electron–and ion–beam lithography", U. Behringer et al., J. Vac. Sci. Technology B 11(6), Nov./Dec. 1993, pp. 2400–2403.

Wolf, Stanley et al, *Silicon Processing For the VLSI Era*, vol. 1, Process Technology, Lattice Press, 1986, pp. 472–483.

*Primary Examiner*—Christopher G. Young
*Attorney, Agent, or Firm*—Stephen A. Gratton

[57] ABSTRACT

A system and method for exposing a layer of resist on a target such as a semiconductor wafer are provided. An optical system includes a step and repeat projection aligner, and a mask having adjacent complementary pattern segments arranged in an alternating array of columns and rows. The method includes exposing the layer of resist in multiple stages by directing exposure energy through the mask onto the target. During each stage the target can be stepped through unequal stepping distances. A first stepping distance can be a width of a single pattern segment, and a second stepping distance can be a combined width of multiple pattern segments. The unequal stepping distances permit the complementary pattern segments to be initially exposed, and then overlayed on the target using relatively short stepping distance across most of the target.

20 Claims, 5 Drawing Sheets

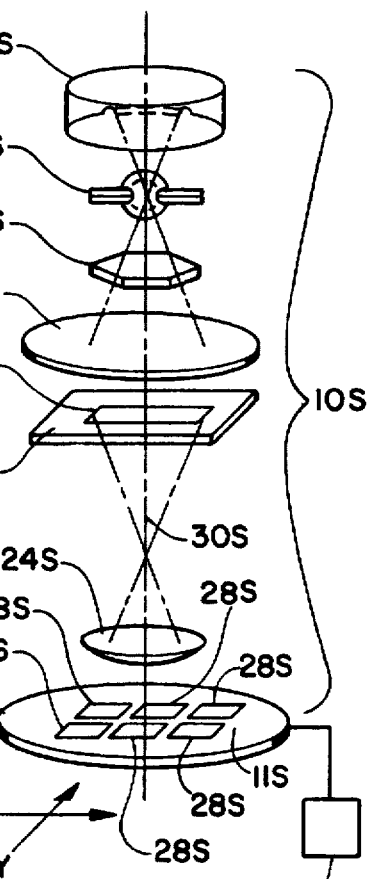

LITHOGRAPHIC SYSTEM AND METHOD FOR EXPOSING A TARGET UTILIZING UNEQUAL STEPPING DISTANCES

FIELD OF THE INVENTION

This invention relates generally to lithography and specifically to an improved method for exposing a target such as a semiconductor wafer, and to a lithographic system suitable for performing the method.

BACKGROUND OF THE INVENTION

One type of lithographic system used in semiconductor manufacture and other applications is known as a "step and repeat" projection aligner. These projection aligners are designed to project a mask pattern onto a layer of resist formed on the wafer. Typically the mask pattern is formed on a mask comprising an opaque layer on a transparent substrate. Following exposure, the layer of resist can be developed to form a resist mask for etching or otherwise patterning the wafer. Typically, the mask pattern can correspond to a die-sized area on the wafer. To pattern the entire wafer, the mask pattern can be stepped-and-repeated across the wafer. This type of projection aligner is also known as a "wafer stepper" because the wafer is stepped, while the mask containing the mask pattern remains stationary.

In addition to "step and repeat" systems, an emerging technology is called "step and scan". In these systems both the mask and wafer "scan" a field, and then the wafer "steps" to the next field. The mask can be scanned across an exposure slit or a slice of a lens. The wafer can be scanned at a speed corresponding to a lens reduction ratio. For example, in a 4× reduction system the mask can be scanned at 100 mm/sec and the wafer at 25 mm/sec.

In addition to optical lithographic systems, non-optical systems utilize ion beams (e.g., hydrogen and helium ions), electron beams, and x-rays for exposing a layer of resist on a target. Non-optical lithographic technologies typically employ membrane masks. This type of mask can include a silicon substrate with a thin (2–3 μm) membrane in the center of the substrate. In addition, the membrane can include physical holes that form the mask pattern.

FIG. 1 illustrates a conventional step and repeat optical projection exposure system 10 for exposing a target 12 coated with a layer of resist 11. The projection exposure system 10 includes an exposure source 14 and a mirror 16 adapted to produce collimated exposure energy of a desired wavelength. Typical mercury lamp exposure sources have an operating range of 365 nm to 436 nm (i line). Other exposure sources include KrF excimer lasers at 248 nm, extreme uV (EuV) at 11–13 nm (soft x-ray), and proximity x-ray at 11 angstroms (hard x-ray).

In addition to the exposure source 14, the projection exposure system 10 includes a filter 18 and a condenser lens 20 located along an optical axis 30 of the system. A mask 22 contains a mask pattern 26 to be projected onto the target 12. The mask 22 typically includes a transparent substrate, such as quartz, having an etched opaque layer, such as chrome, that forms the mask pattern 26. In the illustrative exposure system 10 the mask 22 is square. Other systems can employ masks having a generally circular peripheral configuration.

Directing exposure energy through the mask 22 provides energy for exposing the resist 11 on the target 12 to form individual patterned areas 28A–F. Each patterned area 28A–F corresponds to a single exposure of the mask pattern 26. A reduction lens 24 can be located between the mask 22 and the target 12 so that the patterned areas 28A–F on the target 12 are reduced in size with respect to the mask pattern 26. For example, the mask pattern 26 can be five times larger (5×) than the resultant patterned areas 28A–F. For forming the individual patterned areas 28A–F, the target 12 can be stepped in x and y directions as required by a wafer chuck (not shown) of the projection exposure system 10. The projection exposure system 10 can also include an alignment system (not shown) configured to accurately align the target 12 with respect to the mask 22 for each exposure step.

FIG. 2A illustrates the mask pattern 26. The mask pattern 26 corresponds in size to a single patterned area 28A–F on the target 12. As shown in FIG. 2A, the mask pattern 26 can include multiple pattern segments "A". Each pattern segment "A" can correspond to an area on the target 12 such as a semiconductor die, or a smaller or larger area, as required.

FIG. 2B illustrates a prior art stepping sequence for the target 12 using the mask pattern 26 (FIG. 2A). Initially, a first exposure step (1st) can be performed through the mask pattern 26. This forms the first patterned area 28A on the target 12 comprising multiple pattern segments "A". The pattern segments "A" on the target 12 correspond to the pattern segments "A" on the mask pattern 26. The target 12 (or the mask 22) can then be stepped through a step distance "SD". The step distance "SD" can be along the "x" axis as shown, or alternately along the "y" axis, or along both the "x" and "y" axes.

Next, a second exposure step (2nd) can be performed through the mask pattern 26. This forms the second patterned area 28B on the target 12 comprising multiple pattern segments "A". The second patterned area 28B is offset from the 1st patterned area 28A by the step distance "SD". The target 12 (or the mask 22) can then be stepped by the step distance "SD", and a third exposure step (3rd) through the mask pattern 26 can be performed. This forms the third patterned area 28C on the target 12 comprising multiple pattern segments "A". The third patterned area 28C is offset from the second patterned area 28B by the step distance "SD", and from the first patterned area 28A by twice the step distance "SD". This step and repeat process can be performed until the entire target 12 has been patterned. The stepping distance "SD" remains the same for each exposure step.

Another prior art step and repeat exposure process is illustrated in FIGS. 3A and 3B. In FIG. 3A a mask pattern 26A–B includes complementary pattern segments "A" and "B". The complementary pattern segments "A" and "B" are formed such that the desired patterned areas on the target 12 achieved by double exposing areas of the target 12 by overlaying the "A" and "B" pattern segments.

As shown in FIG. 3B, during a first exposure step (1st) a first patterned area 28A–B1 can be partially formed on the target 12 (FIG. 1). Next, the target 12 can be stepped through a stepping distance "SD", and a second exposure step (2nd) can performed to partially form a second patterned area 28A–B2. Next, the target 12 can be stepped through the stepping distance "SD" and a third exposure step (3rd) can be performed. The 3rd exposure step completes the second patterned area 28A–B2 and partially exposes the third patterned area 28A–B3. This step and repeat process can be repeated across the target 12 with the stepping distance "SD" being equal for each step. As is apparent the patterned areas at the ends of the target 12 remain incomplete.

The step and repeat process is utilized because in general, it is not practical to produce masks and lenses large enough to pattern a target such as an entire semiconductor wafer with a single exposure step. Accordingly, the size of the target is no longer a limiting factor. This permits semiconductor manufacturers to utilize wafers with increasingly larger diameters (e.g., 200 mm, 300 mm).

One limitation of step and repeat lithographic methods is that misalignment of the mask patterns during the stepping sequences can cause inaccuracies in the resultant patterns on the target. For example, masks are subjected to thermal expansion, and various mechanical stresses during lithographic processes. These factors can cause registration errors during mask fabrication as well as during use of the mask to pattern a semiconductor wafer. Mask writing errors, due to thermal effects and mechanical stage placement errors are one source of misregistration. During use of the mask to pattern a semiconductor wafer, these same thermal and mechanical stresses can cause pattern displacement which is exacerbated over larger distances. It is therefore preferential to have complementary patterns as close to one another as feasible. In addition, alignment and registration errors are compounded when the stepping distances are relatively large due to stage mechanical and interferometry tolerances.

In view of the foregoing, improved projection exposure methods and systems are needed in the art.

SUMMARY OF THE INVENTION

In accordance with the present invention a lithographic system and a method for exposing a layer of resist on a target are provided. The method, simply stated, comprises: providing a mask with alternating sequences of complementary pattern segments; and then exposing the target multiple times utilizing unequal stepping distances.

In an illustrative embodiment, the system comprises an optical step and repeat projection aligner configured for use with the mask. The mask can include complementary pattern segments (e.g., A+B) arranged side by side in an alternating sequence (e.g., A–B–A–B etc.). To expose the layer of resist, four separate exposure steps per cycle can be performed. Initially, a first exposure step can be performed by directing exposure energy through the mask onto the target. This forms a first exposure pattern on the target. Next, the target can be moved by a first stepping distance, equal to a width of one pattern segment, and a second exposure step can be performed. The resultant exposure pattern includes middle segments comprising overlays of the A and B patterns and end segments of either A or B patterns. Next, the target can be moved through a second stepping distance equal to a combined width of all the pattern segments minus the width of one pattern segment, and a third exposure step performed. The resultant exposure pattern includes some middle segments that are incomplete. Next, the target can be moved through the first stepping distance and a fourth exposure step performed. The completed patterned area on the target comprises an overlay of the A and B pattern segments. The method can also be employed with three (e.g., A+B+C), or more, pattern segments in an alternating sequence (e.g., A–B–C–A–B–C).

The unequal stepping distances can be performed along the "x" direction or along the "y" direction as required. Because the stepping distances can be made smaller than conventional stepping distances, mask registration errors can be reduced. In addition, stage stepping errors associated with large stepping distances can be reduced. In addition, the adjacent complementary patterns on the mask helps to minimize overlay inaccuracies introduced by mask stresses, mask heating, and mask-writing errors.

BRIEF DESCRIPTION OF THE DRAWINGS

FIG. 4 is a schematic perspective view of a projection exposure system suitable for performing an exposure process in accordance with the invention;

FIG. 5 is a schematic plan view of a mask pattern suitable for performing the exposure process;

FIG. 6A is a schematic plan view of an exposed pattern on a target following a 1st exposure step of the exposure process;

FIG. 6B is a schematic plan view of the exposed pattern on the target following a 2nd exposure step of the exposure process;

FIG. 6C is a schematic plan view of the exposed pattern on the target following a 3rd exposure step of the exposure process;

FIG. 6D is a schematic plan view of the exposed pattern on the target following a 4th exposure step of the exposure process;

DETAILED DESCRIPTION OF THE PREFERRED EMBODIMENTS

Referring to FIG. 4, a projection exposure system 10S adapted to expose a target 12S coated with a layer of resist 11S utilizing unequal stepping distances is illustrated. The projection exposure system 10S comprises a "step and repeat" or "step and scan" light-optical system. However, as will be further explained it is to be understood that the method of the invention can also be practiced with x-ray, electron and ion beam exposure systems.

Figures 1, 2A, 2B, 3A, 3B:
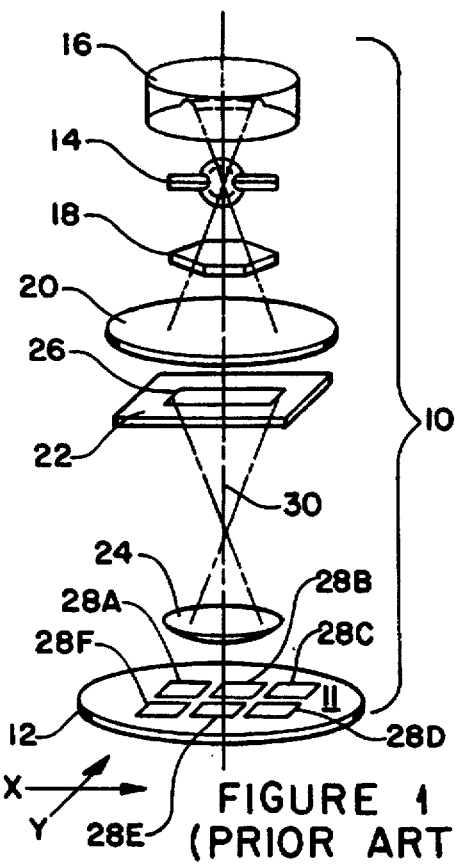
FIG. 1 is a schematic perspective view of a prior art step and repeat projection exposure system.
FIG. 2A is a schematic plan view of a prior art repetitive mask pattern suitable for use with the projection exposure system.
FIG. 2B is a schematic plan view of a prior art step and repeat exposure pattern formed using the mask pattern of FIG. 2A.
FIG. 3A is a schematic plan view of a prior art complementary mask pattern suitable for use with the projection exposure system.
FIG. 3B is a schematic plan view of a prior art step and repeat exposure pattern formed using the mask pattern of FIG. 3A.

The projection exposure system 10S includes a light source 14S, a mirror 16S, a filter 18S, a condenser lens 20S, and a reduction lens 24S. These components function substantially as previously described for the equivalent elements of the prior art system 10 (FIG. 1). In addition, these components can be included in a conventional "step and repeat" or "step and scan" aligner. "Step and repeat" and "step and scan" aligners are available from ASM-Lithography of Veldhoven, The Netherlands. One suitable "step and repeat"aligner is a model PAS 5500/200 which is an i-line system. A suitable "step and scan" system is a model PAS 5500/500 which is a 248 nm Excimer Laser system.

The system 10S can also include a stepping apparatus 32, such as a wafer stepper or similar mechanism, adapted to support and step the target 12S along the x and y axes, as required, through selected distances. The stepping apparatus 32 can be a component of the conventional step and repeat aligner as specified above. The stepping apparatus 32 can be controlled using techniques that are known in the art to produce unequal stepping distances. These techniques can include programmable controllers, and optical, or laser, alignment systems known in the art.

The system 10S also includes a mask 22S having a mask pattern 26S adapted to form patterned areas 28S on the target 12S. The patterned areas 28S are formed in the layer of resist 11S on the target 12S. In the illustrative embodiment, the target 12S comprises a semiconductor wafer, and the patterned areas 28S are formed in conjunction with a semiconductor manufacturing process.

As shown in FIG. 5, the mask pattern 26S includes a plurality of discrete pattern segments "A" and "B". The "A" and "B" pattern segments are preferably "complementary" patterns. In general, the term "complementary" refers to patterns that can be aligned side by side on the mask 22S (FIG. 4), then partially or completely overlayed, or otherwise positioned relative to one another, to achieve the desired patterned areas 28S FIG. 4) on the target 12S. For example, a desired pattern can be split into two half-patterns. The half-patterns can be complementary in that by overlaying their projected images the desired pattern can be produced.

The mask pattern 26S can be formed using techniques that are known in the art. For example, the mask 20S (FIG. 4) can comprise a substrate formed of a transparent material, such as quartz, covered with an opaque layer, such as chrome. Standard mask blanks are supplied by mask manufacturers to include a substrate of a desired size, with an opaque layer deposited thereon to a desired thickness. The mask pattern 26S can be formed by etching the opaque layer of a standard mask blank.

During a mask fabrication process, the mask blank can be coated with a layer of resist, and the resist exposed in a desired pattern using either an optical or electron beam exposure system. An exemplary optical exposure system for fabricating the mask 20S can include a laser mask writer having a laser adapted to directly "write" the pattern onto the resist. An exemplary electron beam exposure system for fabricating the mask 20S can include an e-beam mask writer adapted to directly write the pattern using an electron beam scan. Development of the resist forms a resist mask that can be used to etch the opaque layer to form the mask pattern 26S.

Figure 8:
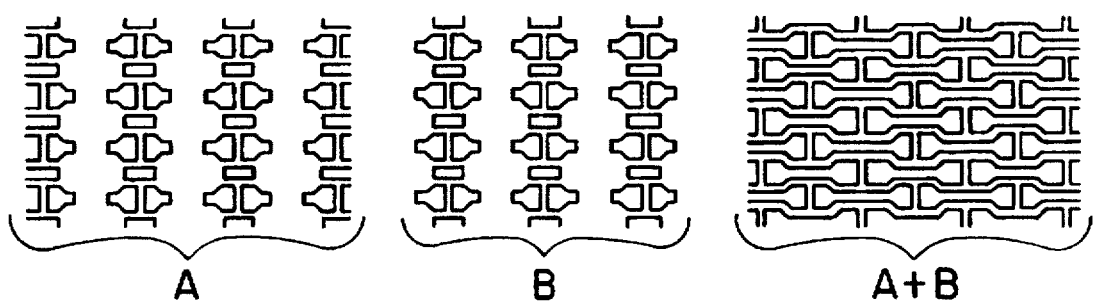
FIG. 8 is a schematic plan view illustrating a combination of complementary half pattern segments to form a desired pattern on the target.

The pattern segments "A" and "B" can be formed as required. Typically, each pattern segment "A" and "B" comprise complementary segments that can be overlayed to form the desired pattern. Exemplary complementary pattern segments "A" and "B" are illustrated in FIGS. 8. In FIG. 8 a half pattern segment "A", can be combined with a complementary half pattern segment "B", to form a desired pattern at the target comprising "A"+"B". Referring again to FIG. 5, the pattern segments "A" and "B" can be arranged in an array of columns "C1–C6" and rows "R1–R3". In the projection exposure system 10S (FIG. 4), the columns "C1–C6" are coincident to the "y" axis and orthogonal to the "x" axis. The rows "R1–R3" are coincident to the "x" axis and orthogonal to the "y" axis. The odd numbered columns include "A" pattern segments and the even numbered columns include "B" pattern segments. In addition, the width "W" of a column is approximately equal to the width of a pattern segment "A" or "B". In general, there are "c" number of columns and "r" number of rows selected as required.

Referring to FIGS. 6A–6D, exposure patterns formed on the target 12S during an exemplary exposure cycle of the system 10S using unequal stepping distances are illustrated. A typical exposure cycle includes four separate exposure steps. FIG. 6A illustrates an exposure pattern 281 on the target 12S following a first exposure step. FIG. 6B illustrates an exposure pattern 282 on the target 12S following a second exposure step. FIG. 6C illustrates an exposure pattern 283 on the target 12S following a third exposure step. FIG. 6D illustrates the completed patterned area 28S on the target 12S As shown in FIG. 6A, a first exposure step forms the exposure pattern 281. The first exposure step can be performed by directing exposure energy along the optical axis 30S (FIG. 4), through the mask 22S (FIG. 4) and onto the target 12S (FIG. 4). The exposure pattern 281 corresponds to the mask pattern 26S (FIG. 5) and includes columns of "A" pattern segments alternating with columns of "B" pattern segments.

Next, as shown in FIG. 6B, the target 12S (FIG. 4) can be stepped along the "x" axis (or alternately along the "y" axis) by a first stepping distance "SD1". The first stepping distance "SD1" can be approximately equal to the width "W" of an "A" or "B" pattern segment. A representative range for the stepping distances "SD1" can be from 3 mm to 12 mm. For a semiconductor fabrication process, the actual distances will be largely dependent on a size of a single die. In general the stepping distances will be only a small fraction of the total projected field. By way of example, a representative projected field of the projection exposure system 10S can be 26 mm in the "x" direction and 34 mm in the "y" direction.

As also shown in FIG. 6B, a second exposure step can be performed substantially as previously described to form the exposure pattern 282. The exposure pattern 282 is one column wider (c+1) than the exposure pattern 281 (FIG. 6A) formed during the first exposure step. The columns on the ends of the exposure pattern 282 have been patterned only a single time with either an "A" or a "B" pattern segment. The middle columns in the exposure pattern 282 have been overlayed with both the "A" and "B" pattern segments.

Next, as shown in FIG. 6C, the target 12S (FIG. 4) can be stepped along the "x" axis (or alternately along the "y" axis) by a second stepping distance "SD2". The second stepping distance "SD2" is approximately equal to the combined width of all the pattern segments minus the width of a single pattern segment. Stated differently, the second stepping distance "SD2" is approximately equal to $(c-1) \times (W)$ where c is the total number of columns and W is the width of a single column.

As also shown in FIG. 6C, a third exposure step can be performed substantially as previously described to form the exposure pattern 28S3. The third exposure step overlays the A and B pattern segments in the end column of the previous exposure pattern 28S2 (FIG. 6B). In addition, the third exposure step single exposes (c−1) additional middle columns.

Next, as shown in FIG. 6D, the target 12S (FIG. 4) can be stepped along the "x" axis (or alternately along the "y" axis) by the first stepping distance "SD1". A fourth exposure step can then be performed by directing exposure energy through the mask 20S substantially as previously described. The fourth exposure step overlays the single exposed columns in exposure pattern 28S3 (FIG. 6C) from the previous exposure step.

The completed patterned area 28S on the target 12S includes unitary patterns on each end and overlayed patterns in the middle. In addition, the patterned area 28S has a total width equal to twice the combined width of the pattern segments minus the width of one pattern segment. Stated differently, the width of the patterned area 28S is equal to (2×(cW))+W.

The four stage exposure process can be repeated until the entire target 12S has been patterned with patterned areas 28S. Each patterned area 28S is formed using the same process as outlined above. The target 12S can then be further processed using conventional techniques. For example, the exposed resist on the target 12S can be developed to form a resist mask for etching or ion implantation processes.

The method can also be employed to combine more than two complementary pattern segments (e.g., three pattern segments, four pattern segments etc.). With three complementary mask patterns, a representative sequence can be to expose, step "W", expose, step "W", expose, step (cW−2W), expose, step "W", expose, step "W", expose, step (cW−2W) etc.

In addition, the method can be used in a step and scan system. In this case the exposure step can be performed in a "scanning" fashion. Still further, the method can be employed in a lithographic system in which both the target and the mask are moved relative to one another. In this case the stepping distances can result from the combined motion of the mask and target.

Figure 7:
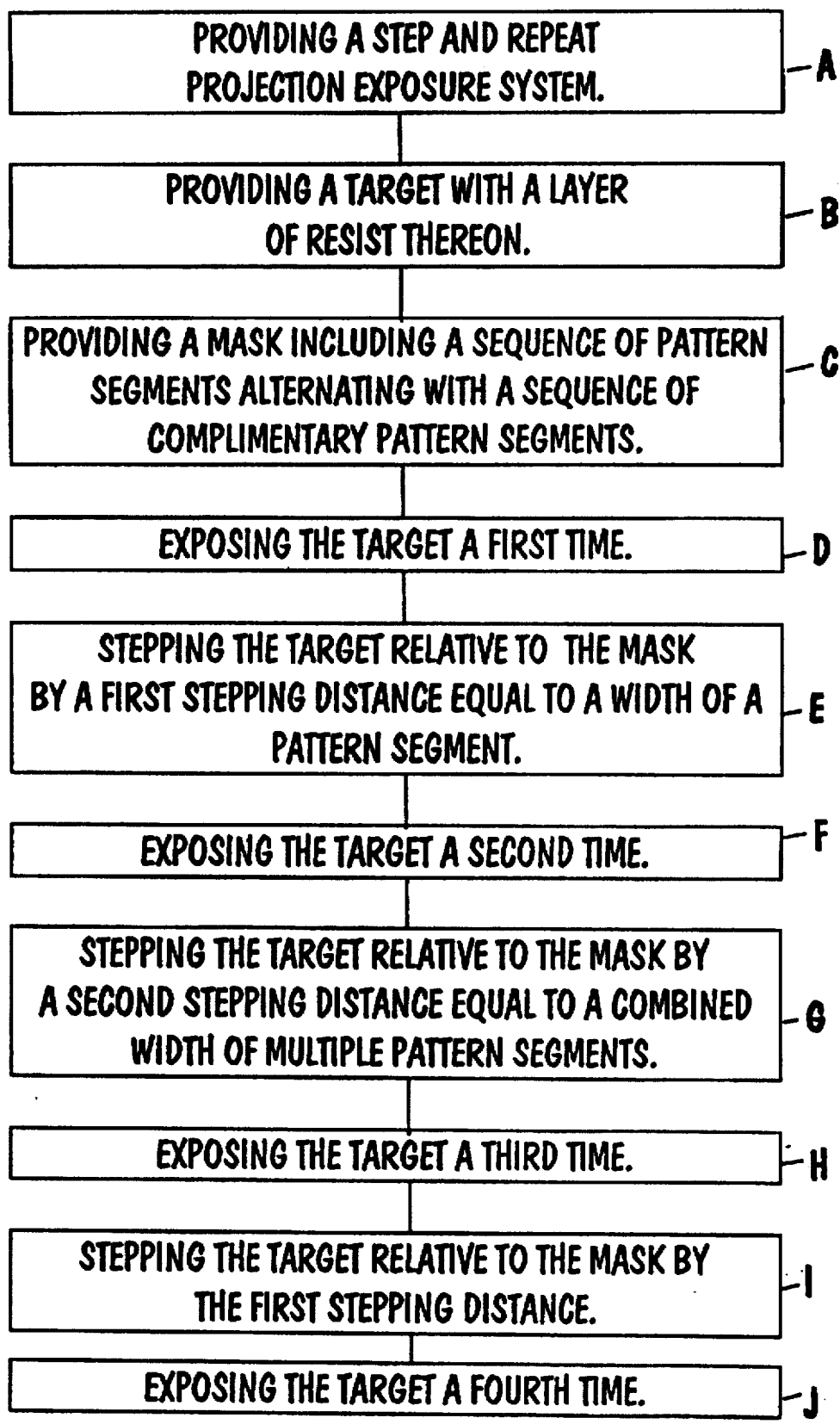
FIG. 7 is a block diagram illustrating steps in the method of the invention.

Referring to FIG. 7, the method for exposing a layer of resist on the target 12S using two complementary pattern segments in an alternating sequence is summarized. The method, broadly stated, includes the steps of:

Providing an exposure system, step A.

Providing a target with a layer of resist thereon, step B.

Providing a mask including a sequence of pattern segments alternating with a sequence of complementary pattern segments, step C.

Exposing the target a first time, step D.

Stepping the target relative to the mask by a first stepping distance equal to a width of a pattern segment, step E.

Exposing the target a second time, step F.

Stepping the target relative to the mask by a second stepping distance equal to a combined width of multiple pattern segments, step G.

Exposing the target a third time, step H.

Stepping the target relative to the mask by the first stepping distance, step I.

Exposing the target a fourth time, step J.

Phase Shift Lithography

Figure 9:
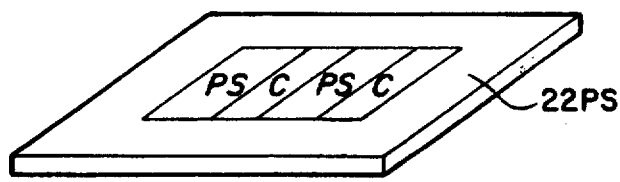
FIG. 9 is a schematic perspective view of a phase shift mask having complementary "phase shift" and "cut" pattern segments.
Figure 10A:
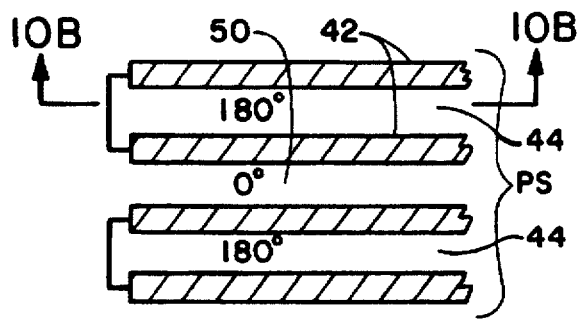
FIG. 10A is a schematic plan view of a "phase shift" pattern segment on the phase shift mask.
Figure 11A:
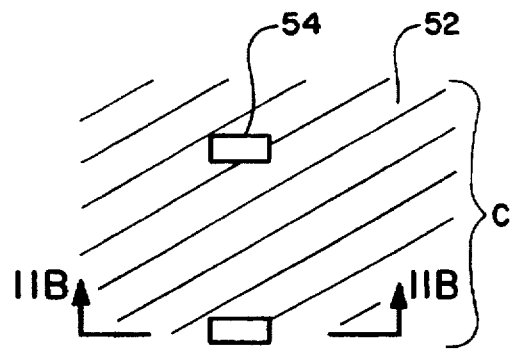
FIG. 11A is a schematic plan view of a "cut pattern" segment on the phase shift mask.
Figure 10B:
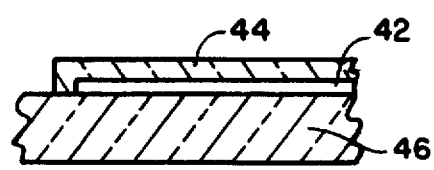
FIG. 10B is a cross sectional view taken along section line 10B—10B of FIG. 10A.
Figure 11B:
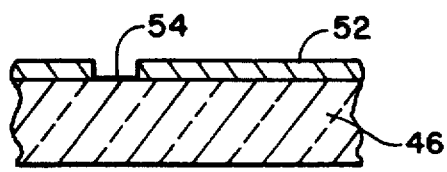
FIG. 11B is a cross sectional view taken along section line 11B—11B of FIG. 11A.
Figure 12A:
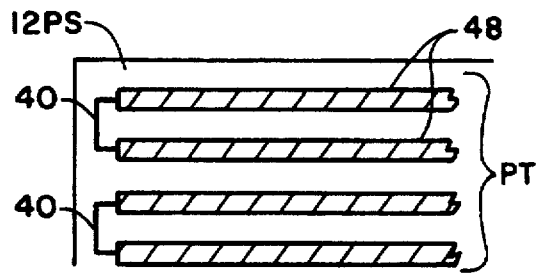
FIG. 12A is a schematic plan view of a pattern formed on a target by the "phase shift" pattern segment of FIG. 10A.

Referring to FIGS. 9, 10A–B, 11A–B, and 12A–B, the method of the invention can also be used in phase shift lithography. In FIG. 9 a phase shift mask 22PS includes phase shift pattern segments "PS" and complementary cut pattern segments "C". The phase shift pattern segments "PS" are adapted to form a phase shift pattern "PT" on a target 12PS (FIG. 12A). The cut pattern segments "C" are adapted to cut stringers 40 (FIG. 12A) from the phase shift pattern "PT".

FIGS. 10A and 10B illustrate an exemplary alternating aperture Levenson phase shift pattern segment "PS". The phase shift pattern segment "PS" includes light blocking opaque members 42 and light transmissive phase shift members 44. As shown in FIG. 10B, the opaque members 42 can comprise a chrome layer formed on a quartz substrate 46. The phase shift members 44 can be formed on the substrate 46 and over the opaque members 42 using an additive process, or a subtractive process (not shown). For example, the phase shift members 44 can be a layer of $SiO_2$ or $Si_3N_4$ deposited on the substrate 46 and opaque members 42 to a desired thickness, then patterned and etched. As shown in FIG. 10A, the phase shift members 44 can be 180° out of phase with adjacent clear areas 50 (0°) on the substrate 46.

As shown in FIG. 12A, the resultant phase shift pattern "PT" formed on a positive tone layer of resist on the target 12PS includes features 48 corresponding to the opaque members 42. In addition, the phase shift pattern "PT" can include stringers 40 corresponding to the 0°–180° transitions areas on the substrate 46 (FIG. 10B).

Figure 12B:
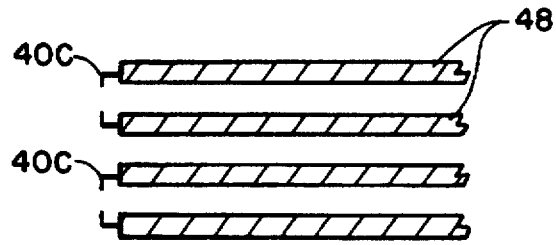
FIG. 12B is a schematic plan view of the pattern on the target following cutting of stringers using the "cut pattern" segment.

As shown in FIG. 12B, the cut pattern segment "C" (FIG. 11A) is adapted to cut the stringers 40 (FIG. 12A) to form cut stringers 40C. As shown in FIGS. 11A and 11B the cut pattern segment "C" can comprise openings 54 in an opaque layer 52 on the substrate 46.

During a lithographic process the phase shifting mask 22PS can be stepped using the method of the invention to alternate the phase shift pattern segments "PS" with the cut pattern segments "C".

Ion Beam Lithography

Figure 13A:
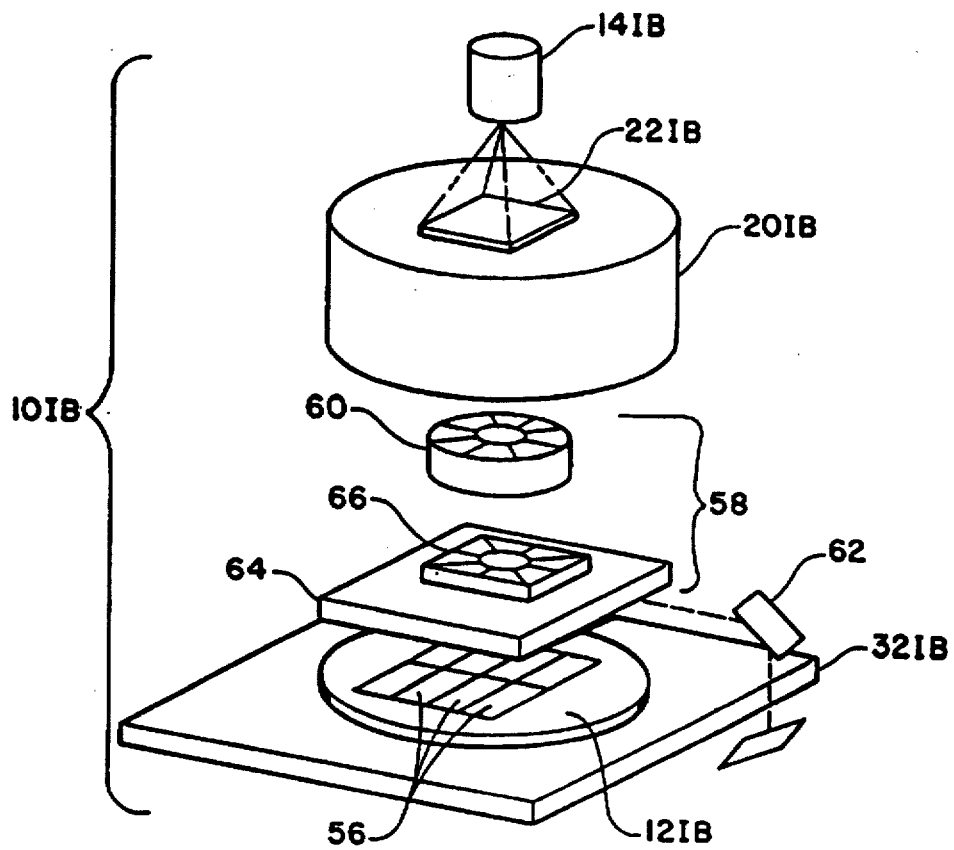
FIG. 13A is a schematic perspective view of an ion beam lithographic system.

The method of the invention can also be practiced in a non optical lithographic system (i.e., x-ray, electron, ion beam). FIG. 13A illustrates an exemplary ion beam lithographic system 10IB. The ion beam lithographic system 10IB includes an ion beam source 14IB, an electrostatic lens system 20IB, a pattern lock system 58, and a stepping apparatus 12IB. The pattern lock system 58 includes a multipole 60, a reference plate 64, a scanner block 66 and an optical target aligner 62. These components can be part of an ion beam stepper. A suitable ion beam stepper, designated the ALG-1000 has been designed by the Advanced Lithography Group of Columbia, Md.

A target 12IB such as a semiconductor wafer can be mounted to the stepping apparatus. In addition, a stencil mask 22IB contains pattern segments "IB1–4" (FIG. 13B) for exposing a layer of resist on the target 12IB. The stencil mask 22IB can comprise a silicon substrate having a membrane formed thereon. The pattern segments "IB1–4" can be openings formed in the membrane.

With this type of stencil mask 22IB it is not possible to form a "donut" shaped feature because the interior portion of the donut cannot be formed. Accordingly techniques have been developed for forming features using complementary pattern segments.

Figure 13B:
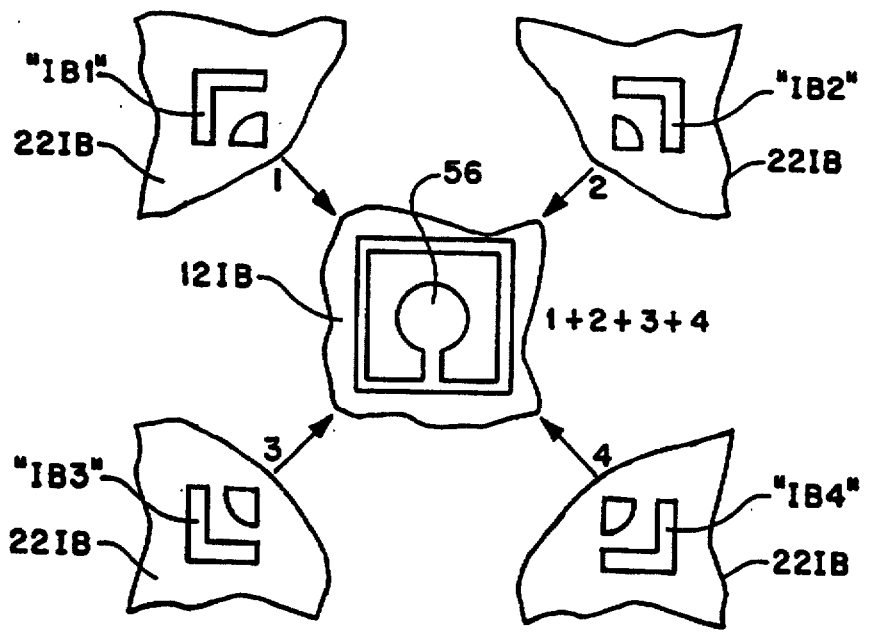
FIG. 13B is a schematic plan view illustrating a combination of complementary "quarter" pattern segments to form a desired pattern on a target in the ion beam lithographic system.

FIG. 13B illustrates the formation of a circular feature 56 on the target 12IB using the complementary pattern segments "TB1-4" and four separate exposure steps. The complementary pattern segments can be stepped using the method of the invention. With four exposures a stepping sequence can comprise expose, step "W", expose, step "W", expose, step "W", expose, step (cW−3W), expose, step "W", etc.

In general the step and stutter can be characterized as follows:

C=number of columns (for step and stutter in y direction use R=number of rows)

W=width of column (or height of row)

N=number of complements (e.g., if A+B then N=2, if A+B+C then N=3)

Initially expose, and then step W and expose for (N-1) times, step a distance of (cW−(N−1)W) and expose, then go back to beginning.

By way of example for N=3 (A, B, C complements in an alternating sequence), a representative staged exposure process using different stepping distances would be as follows:

Expose

Step W and expose (1st time)

Step W and expose (2nd and last time (3−1=2))

Step (cW−(N−1)W) and expose ((then back up to top)).

Thus an improved method and systems for exposing a layer of resist on a target are provided. Because most of the overlayed patterns on the target are exposed using relatively small stepping distances (e.g., the width of a single pattern segment) overlay inaccuracies, and registration errors are reduced. Although the invention has been described with reference to certain preferred embodiments, as will be apparent to those skilled in the art, certain changes and modifications can be made without departing from the scope of the invention as defined by the following claims.

What is claimed is:

1. A method for exposing a layer of resist on a target comprising:

providing a mask comprising an alternating array of first pattern segments and second pattern segments;

exposing the resist by projecting exposure energy through the mask onto the target;

stepping the target by a first distance equal to a width of a pattern segment;

exposing the resist by projecting exposure energy through the mask onto the target;

stepping the target by a second distance equal to a combined width of multiple pattern segments; and exposing the resist by projecting exposure energy through the mask onto the target.

2. The method as claimed in claim 1 wherein the first pattern segments and second pattern segments are arranged in columns and the second distance comprises (c−1)=W, where W equals the width of a pattern segment and c equals a total number of columns.

3. The method as claimed in claim 1 further comprising: exposing the layer of resist a third time;

stepping the target by the first stepping distance; and exposing the layer of resist a fourth time.

4. A method for exposing a layer of resist on a target comprising:

providing a mask comprising a plurality of A pattern segments and a plurality of B pattern segments, said A and B pattern segments arranged in an alternating A−B−A−B array of columns;

forming a first exposure pattern by directing exposure energy through the mask onto the target;

stepping the target by a first stepping distance equal to a width of a pattern segment;

forming a second exposure pattern by directing exposure energy through the mask onto the target;

stepping the target by a second stepping distance equal to a combined width of multiple pattern segments;

forming a third exposure pattern by directing exposure energy through the mask onto the target;

stepping the target by the first stepping distance; and forming a fourth exposure pattern by directing exposure energy through the mask onto the target.

5. The method as claimed in claim 4 wherein the A and B pattern segments comprise complementary half pattern segments.

6. The method as claimed in claim 4 wherein the second stepping distance equals (c−1)×W where c equals a total number of the columns and W equals the width of the pattern segment.

7. In a lithographic system, a method for exposing a layer of resist on a target comprising:

providing a mask comprising a plurality of A pattern segments alternating with a plurality of complementary B pattern segments in an A−B−A−B array, each said A pattern segment and each B pattern segment having an equal width;

exposing the resist by projecting an exposure energy through the mask onto the target;

stepping the target or the mask through a first distance equal to the equal width;

exposing the layer of resist a second time by projecting the exposure energy through the mask;

stepping the target or the mask through a second distance equal to a combined width of multiple A and B pattern segments;

exposing the layer of resist a third time;

stepping the target or mask by the first stepping distance; and exposing the layer of resist a fourth time.

8. The method as claimed in claim 7 wherein the lithographic system includes a stepper apparatus for stepping the target.

9. The method as claimed in claim 7 wherein the lithographic system comprises an optical projector.

10. The method as claimed in claim 7 wherein the lithographic system comprises a system selected from the group consisting of x-ray, ion beam, and electron beam systems.

11. The method as claimed in claim 7 wherein the A pattern segments comprise phase shift patterns and the B pattern segments are configured to cut stringers produced by the phase shift pattern segments.

12. The method as claimed in claim 7 wherein the A and B pattern segments comprise complementary half pattern segments.

13. The method as claimed in claim 7 wherein the target comprises a semiconductor wafer.

14. A method for exposing a Layer of resist on a target comprising:

providing a projection alignment system including a mask comprising a plurality of first pattern segments and a plurality of complementary second pattern segments, said first and second pattern segments formed on the mask in an array of columns with the first pattern segments alternating with the second pattern segments;

exposing the resist in a first stage by directing exposure energy through the mask onto the target;

stepping the target by a first stepping distance equal to a width (W) of a column;

exposing the resist in a second stage by directing exposure energy through the mask onto the target;

stepping the target by a second stepping distance equal to (c−1)×W, where c equals a total number of the columns; and exposing the resist in a third stage by directing exposure energy through the mask onto the target.

15. The method as claimed in claim 14 further comprising stepping the target by the first stepping distance and exposing the resist in a fourth stage by directing exposure energy through the mask onto the target.

16. The method as claimed in claim 14 wherein said array includes rows of pattern segments.

17. A method for exposing a layer of resist on a target comprising:

providing a mask comprising a plurality of phase shifting pattern segments and a plurality of complementary cut pattern segments configured to cut stringers formed on the target by the phase shifting pattern segments;

exposing the resist in a first stage by directing exposure energy through the mask onto the target;

stepping the target by a first stepping distance equal to a width of a pattern segment;

exposing the resist in a second stage by directing exposure energy through the mask onto the target;

stepping the target by a second stepping distance equal to a combined width of multiple pattern segments; and exposing the resist in a third stage by directing exposure energy through the mask onto the target.

18. The method as claimed in claim 17 wherein each phase shifting pattern segment comprises an alternating aperture pattern.

19. The method as claimed in claim 17 wherein the mask comprises a transparent substrate having opaque features and phase shifters formed proximate to edges of the features.

20. A method for exposing a layer of resist on a target comprising:

providing a mask comprising at least three complementary pattern segments (A,B,C), said pattern segments (A,B,C) configured in an array of columns including A pattern columns, B pattern columns, and C pattern columns in an alternating sequence;

exposing the resist in a first stage by directing exposure energy through the mask onto the target;

stepping the target by a first stepping distance equal to a width (W) of a column;

exposing the resist in a second stage by directing exposure energy through the mask onto the target;

stepping the target by the first stepping distance;

exposing the resist in a third stage by directing exposure energy through the mask onto the target;

stepping the target by a second stepping distance equal to (cW−2W), where c equals a total number of the columns; and exposing the resist in a fourth stage by directing exposure energy through the mask onto the target.

* * * * *

UNITED STATES PATENT AND TRADEMARK OFFICE
CERTIFICATE OF CORRECTION

PATENT NO. : 5,780,188
DATED : Jul. 14, 1998
INVENTOR(S) : J. BRETT Rolfson

It is certified that error appears in the above-identified patent and that said Letters Patent is hereby corrected as shown below:

On the title page

Item [75]  Inventor:  J. Brett Rolfson, Boise, Id.

Signed and Sealed this

Fifteenth Day of September, 1998

Attest:

BRUCE LEHMAN

Attesting Officer

Commissioner of Patents and Trademarks